(12) United States Patent
Kashiwabara

(10) Patent No.: US 9,064,450 B2
(45) Date of Patent: Jun. 23, 2015

(54) DISPLAY DEVICE, METHOD FOR DRIVING DISPLAY DEVICE, AND ELECTRONIC APPARATUS

(75) Inventor: Mitsuhiro Kashiwabara, Kanagawa (JP)

(73) Assignee: JOLED INC., Tokyo (JP)

( * ) Notice: Subject to any disclaimer, the term of this patent is extended or adjusted under 35 U.S.C. 154(b) by 948 days.

(21) Appl. No.: 12/042,842

(22) Filed: Mar. 5, 2008

(65) Prior Publication Data

US 2008/0224968 A1    Sep. 18, 2008

(30) Foreign Application Priority Data

Mar. 14, 2007    (JP) .................................. 2007-064950

(51) Int. Cl.
*G09G 3/32*        (2006.01)
*G09G 3/20*        (2006.01)
*H01L 27/32*       (2006.01)

(52) U.S. Cl.
CPC ............ *G09G 3/2003* (2013.01); *G09G 3/3225* (2013.01); *G09G 2300/0452* (2013.01); *G09G 2320/0242* (2013.01); *G09G 2320/043* (2013.01); *G09G 2330/021* (2013.01); *H01L 27/3213* (2013.01); *H01L 27/322* (2013.01)

(58) Field of Classification Search
CPC .......................... H01L 27/3211; G09G 3/3233
USPC ...................... 345/83, 76, 204, 690
See application file for complete search history.

(56) References Cited

U.S. PATENT DOCUMENTS

| | | | | |
|---|---|---|---|---|
| 5,977,718 | A * | 11/1999 | Christensen | 315/169.1 |
| 6,803,955 | B1 * | 10/2004 | Yosida | 348/272 |
| 7,221,090 | B2 * | 5/2007 | Hachiya et al. | 313/504 |
| 7,230,594 | B2 | 6/2007 | Miller et al. | |
| 7,786,496 | B2 * | 8/2010 | Yamazaki et al. | 257/98 |
| 7,791,565 | B2 * | 9/2010 | Fish et al. | 345/76 |
| 7,821,587 | B2 * | 10/2010 | Hosoya | 349/43 |
| 2003/0011613 | A1 * | 1/2003 | Booth, Jr. | 345/589 |
| 2003/0132716 | A1 * | 7/2003 | Yamazaki et al. | 315/169.3 |
| 2005/0100760 | A1 * | 5/2005 | Yokoyama | 428/690 |
| 2006/0164576 | A1 * | 7/2006 | Aoki | 349/114 |

(Continued)

FOREIGN PATENT DOCUMENTS

| | | |
|---|---|---|
| JP | 10-177896 | 6/1998 |
| JP | 2005-063687 | 3/2005 |

(Continued)

OTHER PUBLICATIONS

Japanese Office Action issued Jan. 26, 2012, for corresponding Japanese Appln. No. 2007-064950.

(Continued)

*Primary Examiner* — Pegeman Karimi
(74) *Attorney, Agent, or Firm* — K&L Gates LLP

(57) ABSTRACT

Disclosed herein is a display device including: a red pixel configured to be provided with a red light-emitting element that generates red light; a green pixel configured to be provided with a green light-emitting element that generates green light; and two blue pixels configured to be provided with blue light-emitting elements that generate blue light and have the same structure, wherein a color filter is provided on a light-extraction side of at least one of the two blue pixels so that blue light beams having different y-values in an xy chromaticity coordinate system are extracted from the two blue pixels.

13 Claims, 9 Drawing Sheets

(56) References Cited

U.S. PATENT DOCUMENTS

2006/0175966 A1 8/2006 Yamada et al.
2007/0069996 A1* 3/2007 Kuba et al. .................. 345/76

FOREIGN PATENT DOCUMENTS

| JP | 2005-227586 | 8/2005 |
|---|---|---|
| JP | 2005-338783 | 12/2005 |
| JP | 2006-512732 | 4/2006 |
| JP | 2006-163425 | 6/2006 |
| WO | 01-39554 | 5/2001 |

OTHER PUBLICATIONS

Japanese Patent Office, Final rejection, issued in connection with Japanese Patent Application No. 2007-064950, dated May 23, 2012. (2 pages).

* cited by examiner

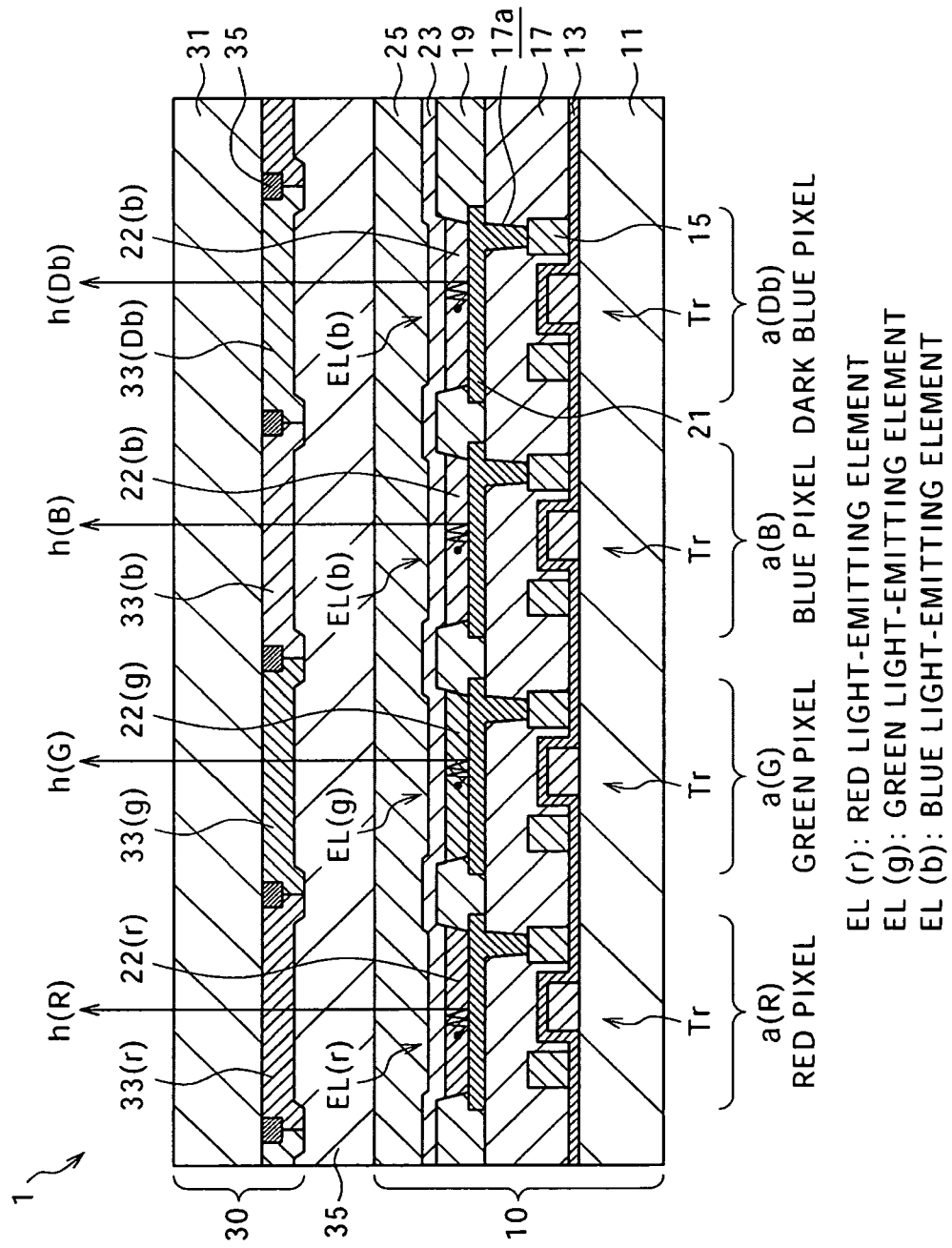

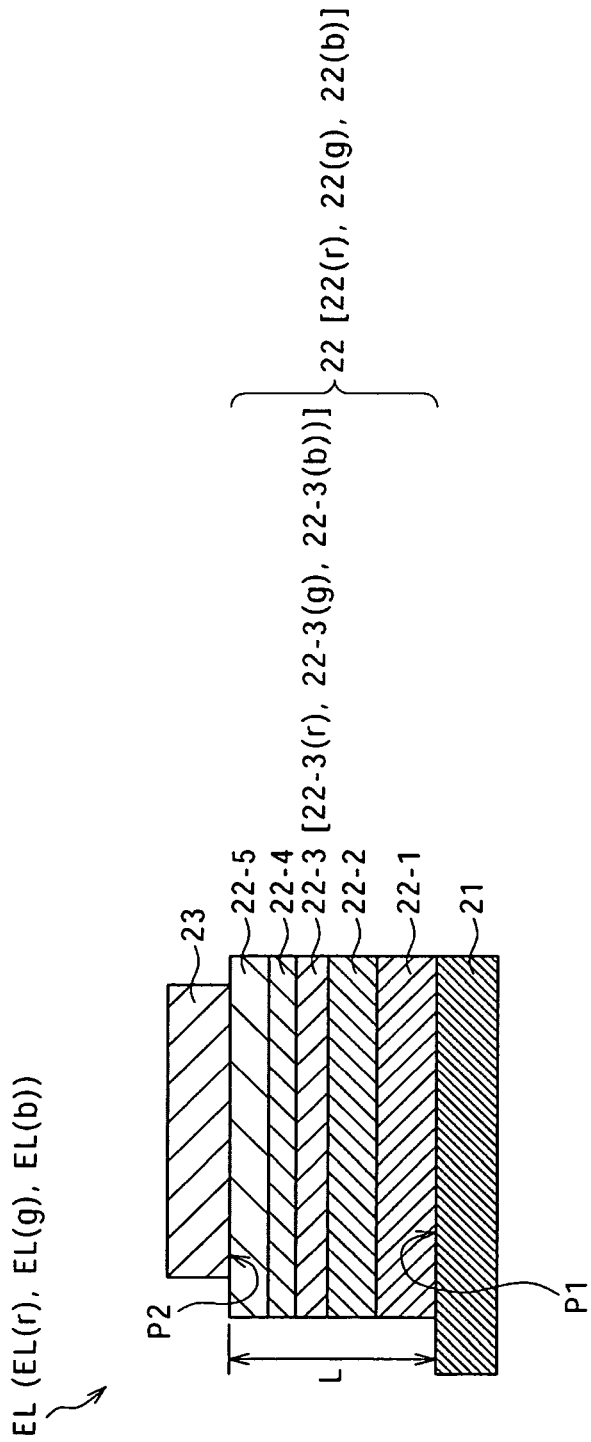

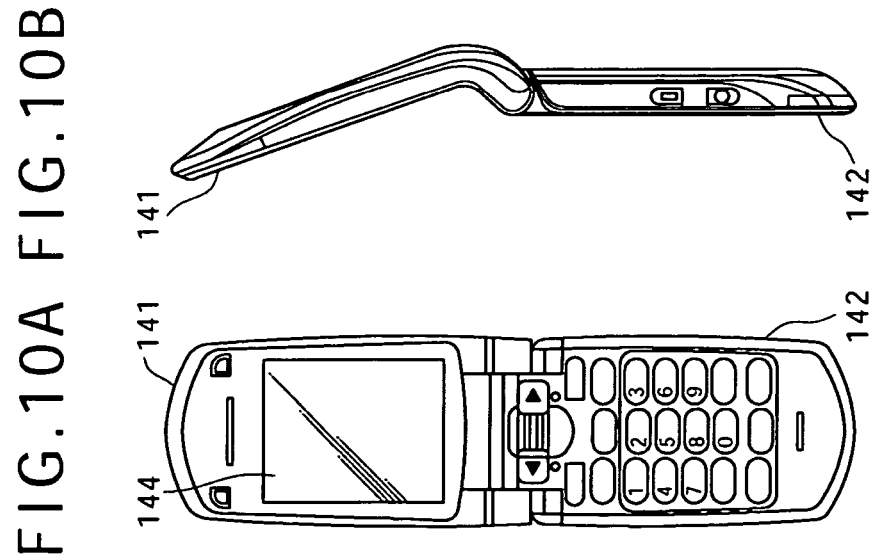
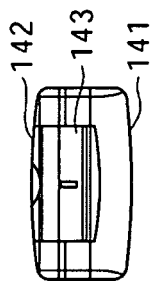
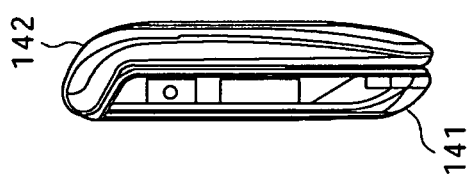
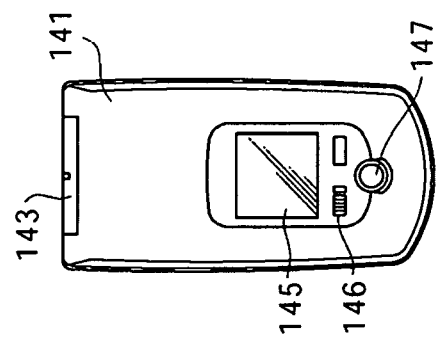
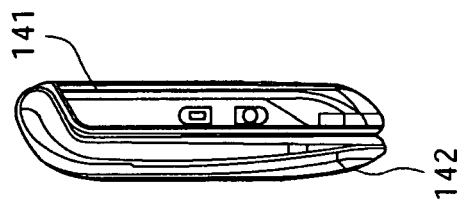
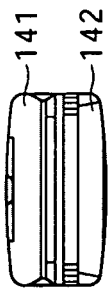

DISPLAY DEVICE, METHOD FOR DRIVING DISPLAY DEVICE, AND ELECTRONIC APPARATUS

CROSS REFERENCES TO RELATED APPLICATIONS

The present application contains subject matter related to Japanese Patent Application JP 2007-064950 filed in the Japan Patent Office on Mar. 14, 2007, the entire contents of which being incorporated herein by reference.

BACKGROUND

The present application relates to a display device, a method for driving a display device, and electronic apparatus, and particularly to a display device formed by arranging organic electroluminescence elements, a method for driving the display device, and electronic apparatus including the display device.

As one of flat panel displays, a display device (so-called organic EL display device) employing organic electroluminescence elements (organic EL elements) is attracting attention. The organic electroluminescence element is a self-luminous element employing an organic electroluminescence (EL) phenomenon, and a display device employing it is advantageous in a wide viewing angle, low power consumption, and light weight.

As configurations for allowing such a display device to perform color displaying, the following ones are known: a configuration in which organic electroluminescence elements for white light emission are combined with color filters; a configuration in which organic electroluminescence elements that emit light of red (R), green (G), and blue (B) are arranged over a substrate; and a configuration in which organic electroluminescence elements of the respective colors are combined with color filters.

In addition, a technique is known in which organic electroluminescence elements are formed to have a "light resonator structure (so-called microcavity structure)" that allows light of the respective colors generated by the organic electroluminescence elements to be extracted after being subjected to resonance in the elements. The organic electroluminescence element having the light resonator structure has enhanced light-extraction efficiency, i.e., enhanced front-light intensity, and enhanced color purity, and therefore is suitable for a full-color display device (refer to e.g. International Patent Publication WO01/039554 pamphlet, and Japanese Patent Laid-Open No. Hei 10-177896).

In recent years, along with wide acknowledgement of usefulness of organic EL display devices, demands for enhancement in the displaying performance thereof are increasing. In particular, importance is placed on the color gamut as a basic performance of the displays device.

Therefore, there have been proposed a display device of an RGBW system arising from addition of pixels from which white light is extracted to pixels in which white light-emitting elements are combined with color filters of R, G, and B, and a displays device of an RGBW system arising from addition of white light-emitting elements to light-emitting elements of R, G, and B. According to a patent document, such an RGBW system offers enhanced luminance for the respective colors and improved power efficiency while keeping accurate color reproduction (refer to Japanese Patent Laid-Open No. 2006-512732 (FIG. 4 and Paragraph 0018 and FIG. 7 and Paragraph 0059)).

In addition, there have also been proposed a display device of an RGBC system in which organic electroluminescence elements for white light emission are combined with color filters of four colors including cyan (C) in addition to R, G, and B, and a display device of an RGBC system arising from addition of pixels in which light-emitting elements of G are combined with a color filter of C to pixels in which light-emitting elements of R, G, and B are combined with color filters of the respective colors. According to a patent document, such an RGBC system offers expanded color gamut and thus allows precise reproduction of colors existing in nature (refer to Japanese Patent Laid-Open No. 2006-163425 (FIG. 30 and Paragraphs 0060 and 0061 and FIG. 35 and Paragraph 0071)).

It is desired for the above-described organic EL displays devices to achieve reduced power consumption and extended lifetime in addition to enhanced color reproducibility. However, the display devices having the above-described respective configurations may not sufficiently achieve reduced power consumption and an enhanced lifetime characteristic.

SUMMARY

In an embodiment, the present application provides a display device that is allowed to achieve reduced power consumption and extended lifetime in addition to enhanced color reproducibility, a method for driving the display device, and electronic apparatus employing the display device.

According to an embodiment, there is provided a display device including a red pixel configured to be provided with a red light-emitting element that generates red light, a green pixel configured to be provided with a green light-emitting element that generates green light, and two blue pixels configured to be provided with blue light-emitting elements that generate the same blue light and have the same structure, and thus, the blue light-emitting elements have the same lifetime characteristics. Furthermore, a color filter is provided on the light-extraction side of at least one of these two blue pixels. Due to this feature, blue light beams having different y-values in the xy chromaticity coordinate system are extracted from these two blue pixels.

In such a configuration, the color gamut is expanded toward blue of a lower y-value due to the provision of two blue pixels from which blue light beams having different y-values in the xy chromaticity coordinate system are extracted. Moreover, for the blue pixel that offers a higher y-value, the light-extraction efficiency can be enhanced by omitting the provision of the color filter or decreasing the density of the color filter. Therefore, in the case of displaying in which there is no need to expand the color gamut toward blue of a lower y-value, the blue pixel that offers a higher y-value and has more favorable light-extraction efficiency, of two blue pixels, is selected and used, so that power consumption is reduced. Because the necessary current of the blue light-emitting element is particularly large, the selection from two blue pixels can suppress the power consumption.

As described above, according to an embodiment, in a display device including light-emitting elements and electronic apparatus employing the display device, the color gamut is expanded and thus the color reproducibility can be enhanced. Furthermore, power consumption can be suppressed, which can achieve the extension of the lifetime of the light-emitting elements.

Additional features and advantages are described herein, and will be apparent from the following Detailed Description and the figures.

BRIEF DESCRIPTION OF THE FIGURES

FIG. 2 is a sectional view for explaining the configuration of major part of the displays device of the embodiment;

FIG. 3 is a configuration diagram of an organic electroluminescence element provided in the displays device of the embodiment;

FIGS. 10A to 10G are diagrams showing a cellular phone as portable terminal apparatus to which the embodiment is applied: 10A and 10B are a front view and side view, respectively, of the opened state, and FIGS. 10C to 10G are a front view, left-side view, right-side view, top view, and bottom view, respectively, of the closed state;

DETAILED DESCRIPTION

An embodiment will be described in detail below with reference to the accompanying drawings.

<Panel Configuration of Display Device>

Figure 1A:
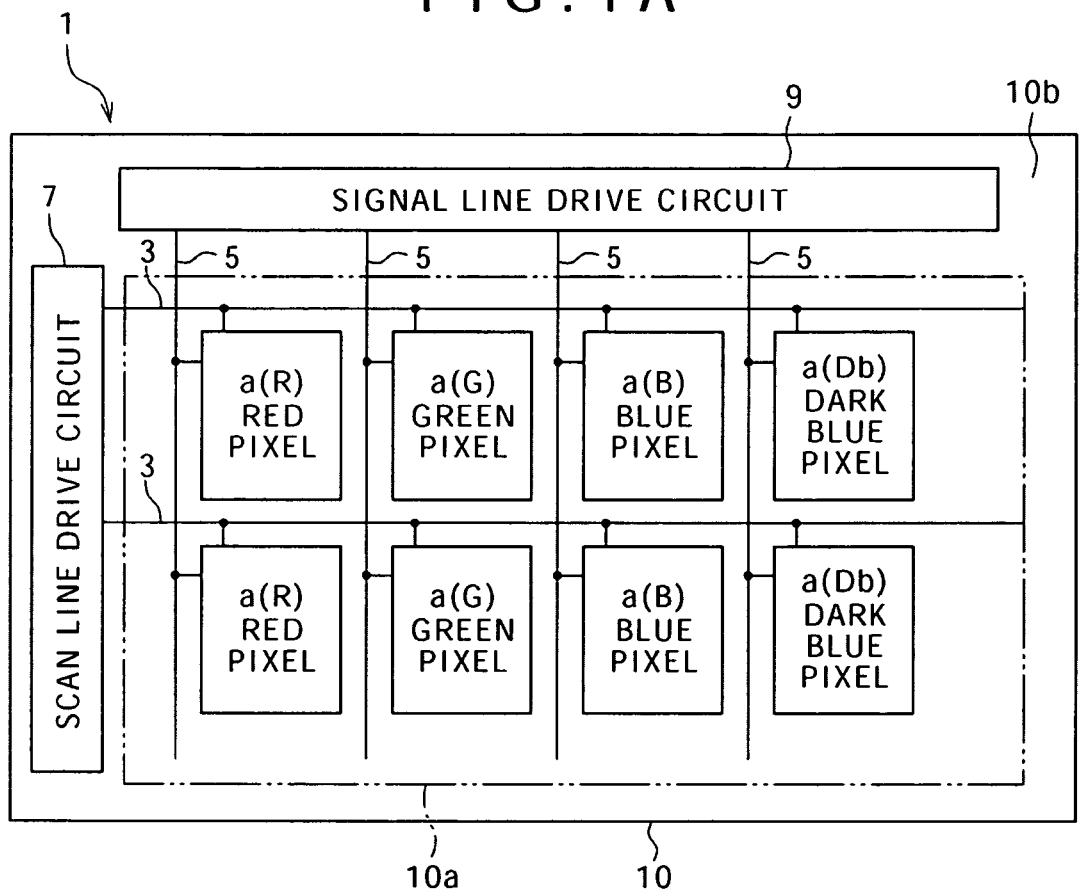
FIGS. 1A and 1B are diagrams showing one example of the panel configuration and a pixel circuit in a display device according to an embodiment.
Figure 1B:
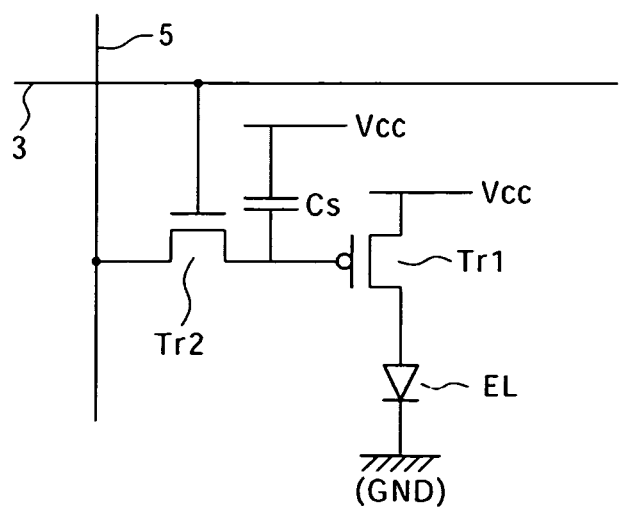

FIG. 1 is a diagram showing one example of a display device 1 according to the embodiment of the present invention. FIG. 1A is a schematic configuration diagram of the display device 1, and FIG. 1B is a diagram showing the configuration of a pixel circuit. The following description will deal with applying of the embodiment of the present invention to the display device 1 of the active-matrix system in which organic electroluminescence elements EL are employed as light-emitting elements.

As shown in FIG. 1A, this display device 1 includes a drive panel 10. On the drive panel 10, a display area 10a and a peripheral area 10b are defined.

The display area 10a is formed as a pixel array part in which plural scan lines 3 and plural signal lines 5 are provided along the horizontal direction and the vertical direction, respectively, and one pixel a is provided corresponding to each of the intersections between these lines. In particular, one pixel group is composed of four pixels of a red pixel a(R) from which red light is extracted, a green pixel a(G) from which green light is extracted, a blue pixel a(B) from which blue light is extracted, and a dark blue pixel a(Db) from which dark blue light is extracted as second blue light. Plural pixel groups are arranged in a matrix on a substrate. In each of the pixels a, the organic electroluminescence element EL is provided.

Provided in the peripheral area 10b are a scan line drive circuit 7 for scan-driving the scan lines 3 and a signal line drive circuit 9 for supplying video signals (i.e., input signals) dependent upon luminance information to the signal lines 5.

As shown in FIG. 1B, the pixel circuit provided in each pixel a includes e.g. the organic electroluminescence element EL, a drive transistor Tr1, a write transistor (sampling transistor) Tr2, and a holding capacitor Cs. Due to driving by the scan line drive circuit 7, a video signal written from the signal line 5 via the write transistor Tr2 is held in the holding capacitor Cs, and the current dependent upon the amount of the held signal is supplied from the drive transistor Tr1 to the organic electroluminescence element EL, so that the organic electroluminescence element EL emits light with the luminance dependent upon the current value.

This pixel circuit configuration is merely one example, and the pixel circuit may further include an additional capacitive element and plural transistors according to need. Furthermore, a requisite drive circuit is added to the peripheral area 10b according to the change of the pixel circuit.

<Major Configuration of Display Device>

FIG. 2 is a diagram showing the sectional configuration of major part of the display device 1. Specifically, the sectional configuration of major part including four pixels in the display area is shown in FIG. 2. As shown in this drawing, for the display device 1, a sealing panel 30 is disposed to face the above-described drive panel 10, and the entire surfaces of these panels are bonded to each other by an adhesive layer 35 composed of thermosetting resin or the like.

The drive panel 10 is formed by using a substrate 11 composed of an insulating material such as glass. Over the substrate 11, transistors Tr, an insulating layer 13, drive interconnects 15, and a planarization insulating layer 17 are provided in that order. On this planarization insulating film 17, a red light-emitting element EL(r), a green light-emitting element EL(g), and two blue light-emitting elements EL(b) are provided as the organic electroluminescence elements EL in the respective pixels a.

Each of the organic electroluminescence elements EL is composed of e.g. a lower electrode 21 formed of a reflective electrode, a light-emission functional layer 22 formed by stacking organic materials mainly, and an upper electrode 23 composed of a semi-transmissive material. These organic electroluminescence elements EL are isolated from each other by a window insulating film 19 that covers the peripheries of the lower electrodes 21.

Upper part of the organic electroluminescence elements EL is covered by a protective film 25, and the sealing panel 30 is bonded onto this protective film 25 via the adhesive layer 35.

The sealing panel 30 is formed by using a substrate 31 composed of an insulating material such as glass. On the surface of the substrate 31 facing the organic electroluminescence elements EL, color filters 33 of the respective colors are provided at the positions opposite to the organic electroluminescence elements EL. A black matrix (reflected-light absorbing film) 35 is provided among these color filters 33.

A feature of the present embodiment exists in the configuration and combination of the above-described four organic electroluminescence elements EL and color filters 33. Specifically, a red filter 33(r) is provided above the red light-emitting element EL(r), and a green filter 33(g) is provided above the green light-emitting element EL(g). In addition, a first blue filter 33(b) is provided above one blue light-emitting element EL(b), and a second blue filter 33(Db) is provided above the other blue light-emitting element EL(b), and both blue-light emitting elements EL(b) generate the same blue light, have the same structure, and have the same lifetime characteristics. A specific example of such a combination will be described later.

<Configurations of Respective Components of Display Device>

The detailed configurations of the above-described respective components will be described below.

The transistors Tr provided on the substrate 11 of the drive panel 10 are formed of thin film transistors serving as the drive transistor and the write transistor shown in FIG. 1. The configuration of these thin film transistors is not particularly limited but the transistors mall be either bottom-gate transistors or top-gate transistors for example.

The insulating film 13 is composed of e.g. a silicon oxide, phospho-silicate glass (PSG), or the like. In this insulating film 13, connection holes (not shown) are so provided as to reach the source/drain of the transistors Tr.

The interconnects 15 have a thickness of e.g. about 1.0 μm and are composed of aluminum (Al) or an aluminum (Al)-copper (Cu) alloy.

The planarization insulating film 17 is so provided as to cover the interconnects 15, and fills recesses and projections due to the transistors Tr and the interconnects 15 to thereby offer a flat surface. In this planarization insulating film 17, connection holes 17a reaching the interconnects 15 are provided.

The configuration of the respective organic electroluminescence elements EL will be described below with reference to FIG. 2 and the enlarged sectional view of FIG. 3.

Each organic electroluminescence element EL is formed by stacking, from the substrate side, the lower electrode 21 formed of a reflective electrode, the light-emission functional layer 22 formed by stacking organic materials mainly, and the upper electrode 23 composed of a semi-transmissive/semi-reflective material as described above. Either one of the lower electrode 21 and the upper electrode 23 is formed as the anode, and the other is formed as the cathode. In the present example, the lower electrode 21 is formed as the anode, and the upper electrode 23 is formed as the cathode.

The lower electrode 21 is patterned for each pixel and connected to the interconnect 15 via the connection hole 17a provided in the planarization insulating film 17. In contrast, the upper electrode 23 is provided on the light-emission functional layer 22 as an electrode common to the respective pixels.

Each light-emission functional layer 22 is obtained by sequentially stacking e.g. a hole injection layer 22-1, a hole transport layer 22-2, a light-emitting layer 22-3, an electron transport layer 22-4, and an electron injection layer 22-5 in that order from the lower electrode (anode) side. The provision of the layers other than the light-emitting latter 22-3 is according to need. In the organic electroluminescence elements EL(r), EL(g), and EL(b) of the respective colors, the light-emission functional layers 22 are formed as the light-emission functional layers 22(r), 22(g), and 22(b), respectively, in each of which at least the light-emitting layer 22-3 for generating light with the wavelength corresponding to a respective one of the colors is pattern-formed by using a material selected on an element-by-element basis. In this case, the layers other than the light-emitting layer 22-3 may be provided as layers common to the respective pixels.

The respective organic electroluminescence elements EL having the above-described multilayer structure are formed to have a resonator structure that allows light generated by the light-emission functional layers 22(r), 22(g), and 22(b) to be extracted through the upper electrode 23 after being subjected to resonance between the lower electrode 21 formed of a reflective electrode and the upper electrode 23 composed of a semi-transmissive/semi-reflective material.

Specifically, these organic electroluminescence elements EL have a resonator structure in which the interface between the lower electrode 21 and the light-emission functional layer 22 serves as a first end P1 and the interface between the upper electrode 23 and the light-emission functional layer 22 serves as a second end P2 and the light-emission functional layer 22 serves as a resonator. If the organic electroluminescence elements EL are thus provided with a resonator structure, the multiple interference of light generated by the light-emitting layer 22-3 occurs and thus the elements EL serve as a kind of narrow band filter. This decreases the half-value width of the spectrum of the light that is to be extracted through the upper electrode 23 composed of a semi-transmissive/semi-reflective material, and therefore can enhance the color purity. Furthermore, external light incident on the organic electroluminescence elements EL through the sealing panel 30 can be attenuated due to multiple interference. Thus, visibility can be enhanced by extremely decreasing the reflectivity of the organic electroluminescence elements EL with respect to external light based on the combination with the color filters 33 to be described later or a retardation plate and a polarization plate (not shown).

For this feature, it is important that the optical distance L between the first end (reflective plane) P1 and the second end (semi-transmissive plane) P2 of the resonator be so designed as to satisfy Equation (1) shorten below to thereby match the resonance wavelength of the resonator (the peak wavelength of the spectrum of the light that is to be extracted) with the peak wavelength of the spectrum of the light that is desired to be extracted.

$$L=(m\Phi/2\pi)\lambda/2 \qquad (1)$$

In Equation (1), L denotes the optical distance between the first end P1 and the second end P2, m denotes the order (0 or a natural number), $\Phi$ denotes the sum of the phase shift $\Phi 1$ of reflected light arising at the first end P1 and the phase shift $\Phi 2$ of reflected light arising at the second end P2 ($\Phi=\Phi 1+\Phi 2$) [rad], and $\lambda$ denotes the peak wavelength of the spectrum of the light that is desired to be extracted through the second end P2. In Equation (1), the unit of L is the same as that of $\lambda$, and e.g. (nm) is used as the unit.

It is desirable in terms of enhancement in the light-emission efficiency that the lower electrode 21, which offers the first end P1 of such a resonator structure, have as high reflectivity as possible. Furthermore, because the lower electrode 21 is used as the anode, it is possible for the lower electrode 21 to be composed of a metal, metal oxide, or the like having a comparatively high work function. Such a lower electrode 21 is in the range of 30 nm to 2000 nm in the thickness along the stacking direction, and is formed by using a silver alloy film, aluminum-neodymium alloy film, or the like.

On the other hand, the upper electrode 23, which offers the second end P2 of the resonator structure, is used as a semi-transmissive reflective layer. It is desirable in terms of decreasing of loss due to absorption that the total sum of the reflectivity and the transmittance of the upper electrode 23 be as close to 100% as possible and the absorptivity thereof be as low as possible. Furthermore, because the upper electrode 23 is an electron injection electrode used as the cathode, it is preferable for the upper electrode 23 to have a low barrier to electron injection to the light-emission functional layer 22 and be composed of a metal having a low work function. Moreover, the upper electrode 23 should function as an electrode having sufficient electric conductivity to supply electrons to the light-emission functional layer 22 even when the upper electrode 23 is so thin that loss due to light absorption can be prevented as described above.

As the material of such an upper electrode 23, e.g. a metal thin film composed of an alloys containing silver (Ag) and an alkali metal or alkaline earth metal such as magnesium (Mg), calcium (Ca), or sodium (Na). In particular, a metal thin film composed of an alloy containing Mg and Ag is preferable. This is because a metal thin film composed of an alloy, containing Mg and Ag is the most suitable as the electrode on the light-extraction side of a light resonator structure because it can be stably vacuum-evaporated and an organic electroluminescence element can be driven even when the thickness of the film is as small as about 5 nm to 10 nm. Furthermore, this is because the upper electrode 23 composed of an alloy containing Mg and Ag involves few defects and can provide highly-reliable light emission because it can be easily formed by a film deposition method in which damage to organic films is small, such as resistor-heating evaporation.

The respective layers in the light-emission functional layer 22 provided between the above-described lower electrode 21 and upper electrode 23 will be described below from the lowermost layer.

The hole injection layer 22-1 is to enhance the hole injection efficiency. Such a hole injection layer 22-1 is composed of e.g. a hexaazatriphenylene derivative, aromatic amine derivative, or another publicly-known material, and has a thickness in the range of 4 nm to 100 nm as one example.

The hole transport layer 22-2 is to enhance the efficiency of hole transportation to the light-emitting layer 22-3. Such a hole transport layer 22-2 is composed of e.g. bis[(N-naphthyl)-N-phenyl]benzidine ($\alpha$-NPD) and has a thickness in the range of 5 nm to 300 nm as one example.

In the light-emitting layer 22-3, the recombination between electrons and holes occurs and thereby light is generated, in response to electric field application. The configuration of the light-emitting layer 22-3 differs for each of the organic electroluminescence elements EL(r), EL(g), and EL(b) of the respective colors.

The light-emitting layer 22-3($r$) of the red light-emitting element EL(r) is composed of e.g. Alq3 mixed with 40 vol. % of 2,6-bis[4-[N-(4-methoxyphenyl)-N-phenyl]aminostyryl] naphthalene-1,5-dicarbonitrile (BSN-BCN). The thickness thereof is in the range of 10 nm to 100 nm as one example.

The light-emitting layer 22-3($g$) of the green light-emitting element EL(g) is composed of e.g. Alq3 mixed with 3 vol. % of coumarin 6. The thickness thereof is in the range of 10 nm to 100 nm as one example.

The light-emitting layer 22-3($b$) of the blue light-emitting element EL(b) in both of the blue pixel a(B) and the dark blue pixel a(Db), is composed of e.g. ADN (9,10-di(2-naphthyl) anthracene) mixed with 1 vol. % of perylene. The thickness thereof is in the range of 10 nm to 100 nm as one example.

The electron transport layer 22-4 is to enhance the efficiency of electron transportation to the light-emitting layer 22-3. Such an electron transport layer 22-4 is composed of e.g. Alq3 and has a thickness in the range of 5 nm to 300 nm as one example.

The electron injection layer 22-5 is to enhance the electron injection efficiency. It is preferable that such an electron injection layer 22-5 be composed of an alloy between an alkali metal or alkaline earth metal such as lithium (Li), magnesium (Mg), or calcium (Ca) and a metal such as silver (Ag), aluminum (Al), or indium (In), and specifically composed of an Mg—Ag alloy. Furthermore, it is also preferable that the electron injection layer 22-5 be composed of a compound between an alkali metal or alkaline earth metal such as Li, Mg, or Ca and a halogen such as fluorine or bromine or oxygen, and specifically composed of LiF. Alternatively, the electron injection layer 22-5 may be composed of a material obtained by adding an alkali metal such as Mg to an electron-transport organic material such as 8-quinolinol aluminum complex (Alq3). More alternatively, the electron injection layer 22-5 may have a structure arising from stacking of films of two or more kinds of the above-described materials.

If the electron injection layer 22-5 is composed of an alkali metal halogenide such as LiF, alkaline earth metal halogenide, alkali metal oxide, or alkaline earth metal oxide, it is preferable that the thickness of the electron injection layer 22-5 be in the range of 0.3 nm to 1.3 nm. This is because such a thickness can provide decreased drive voltage and enhanced light-emission efficiency.

The window insulating film 19 for isolating the thus formed organic electroluminescence elements EL from each other is provided to assure insulation between the lower electrodes 21 and the upper electrode 23 and accurately offer a desired shape as the shape of the light-emission areas of the organic electroluminescence elements EL (i.e., the pixel apertures).

Such a window insulating film 19 is composed of e.g. photosensitive resin such as polyimide. The window insulating film 19 is so provided on the planarization insulating film 17 as to cover the peripheral edges of the lower electrodes 21, and has apertures through which the center parts of the lower electrodes 21 are exposed. The light-emission functional layers 22 are so provided as to cover the insides of the apertures, and the upper electrode 23 is so provided as to be insulated from the lower electrodes 21 by the light-emission functional layers 22 and the window insulating film 19.

The protective latter 25 covering the organic electroluminescence elements EL is a passivation film composed of a transparent dielectric material. Specifically, it is composed of e.g. a silicon oxide ($SiO_2$), silicon nitride (SiN), or the like. The thickness thereof is in the range of 500 nm to 10000 nm as one example.

The substrate 31 of the sealing panel 30 is composed of a material, such as glass, having optical transparency with respect to emitted light from the organic electroluminescence elements EL.

The color filters 33 of the respective colors provided on the substrate 31 are to extract light generated by the organic electroluminescence elements EL and absorb external light reflected by the organic electroluminescence elements EL and interconnects among the pixels to thereby improve the contrast.

Of the color filters 33, the red filter 33($r$) is to extract red light h(R) that is generated by the red light-emitting element EL(r) and subjected to resonance, and absorb external light reflected by the organic electroluminescence elements EL and interconnects among the pixels to thereby improve the contrast. The pixel provided with the red filter 33($r$) serves as the red pixel a(R).

The green filter 33($g$) is to extract green light h(G) that is generated by the green light-emitting element EL(g) and subjected to resonance, and absorb external light reflected by the organic electroluminescence elements EL and interconnects among the pixels to thereby improve the contrast. The pixel provided with the green filter 33($g$) serves as the green pixel a(G).

The first blue filter 33($b$) is to extract blue light h(B) that is generated by the blue light-emitting element EL(b) and subjected to resonance, and absorb external light reflected by the organic electroluminescence elements EL and interconnects among the pixels to thereby improve the contrast. Hereinafter, the first blue filter 33(b) will be referred to simply as the blue filter 33(b). The pixel provided With the blue filter 33(b) serves as the blue pixel a(B).

On the other hand, the second blue filter 33(Db) is to extract, of light that is generated by the blue light-emitting element EL(b) and subjected to resonance, blue light whose y-value in the xy chromaticity coordinate system is lower than that of the light obtained through the blue filter 33(b), i.e., to extract dark blue light h(Db). Furthermore, the second blue filter 33(Db) is to absorb external light reflected by the organic electroluminescence elements EL and interconnects among the pixels to thereby improve the contrast. Hereinafter, the second blue filter 33(Db) will be referred to simply as the dark blue filter 33(Db). The pixel provided with the dark blue filter 33(Db) serves as the dark blue pixel a(Db). Such a dark blue filter 33(Db) is formed by setting the color filter density thereof higher than that of the blue filter 33(b) or changing the transmission spectrum thereof.

FIG. 4 shows the xy chromaticity coordinates of the respective colors R, G, B, and Db of the light beams h(R), h(G), h(B), and h(Db) that are emitted from the pixels a(R), a(G), a(B), and a(Db) through the color filters of the respective colors. As shown in these diagrams, the dark blue Db obtained from the dark blue pixel a(Db) is lower than the blue B obtained from the blue pixel a(B) in the y-value in the xy chromaticity coordinate system.

Figure 4A:
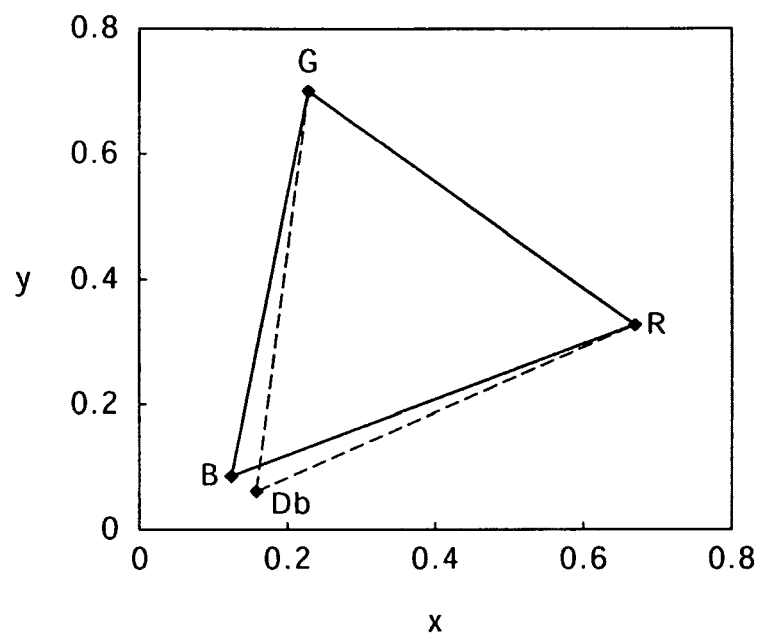
FIGS. 4A and 4B are chromaticity diagrams regarding four pixels provided in the display device of the embodiment.

As shown in FIG. 4A, the dark blue Db obtained from the dark blue pixel a(Db) may be outside the color gamut formed by the red R obtained from the red pixel a(r), the green G obtained from the green pixel a(g), and the blue B obtained from the blue pixel a(b).

Figure 4B:
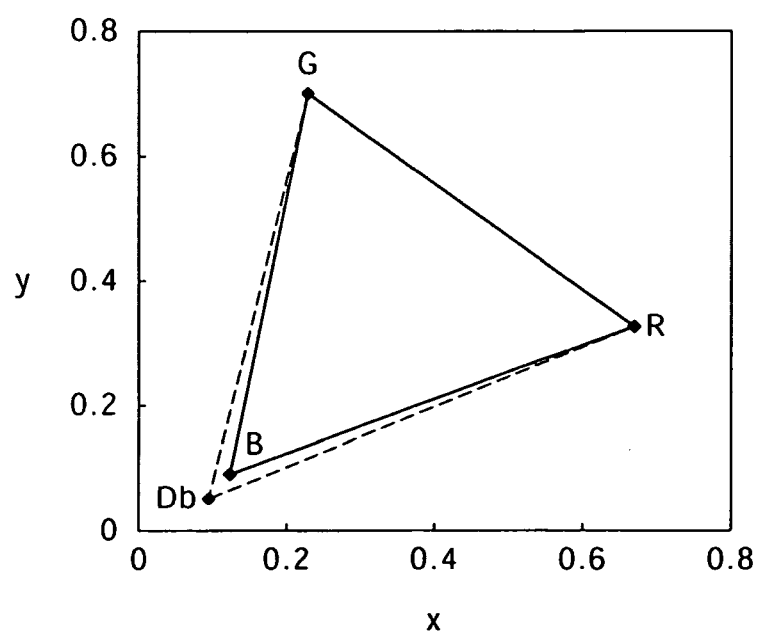

Furthermore, as shown in FIG. 4B, the dark blue Db obtained from the dark blue pixel a(Db) may be outside the color gamut formed by the red R obtained from the red pixel a(r), the green G obtained from the green pixel a(g), and the blue B obtained from the blue pixel a(b).

The above-described color filters 33 are each formed into e.g. a rectangular shape without leaving any gap thereamong. Each of these color filters 33 is formed of resin mixed with a pigment. Through selection of the pigment, the optical transmittances of the color filters 33 are so adjusted that the optical transmittance for the wavelength range of the intended red, green, blue, or dark blue is high and the optical transmittance for the other wavelength range is low.

The black matrix 35 is provided along the boundaries among the respective color filters 33. Furthermore, the black matrix 35 is formed of e.g. a black resin film that is mixed with a black colorant and has an optical density equal to or higher than 1, or a thin film filter employing the interference of the thin film. Of these materials, the black resin film is preferable because it can be easily formed at low cost. On the other hand, the thin film filter is formed by stacking one or more thin films composed of e.g. a metal, metal nitride, or metal oxide, and is to attenuate light by utilizing the interference of the thin film. Specific examples of such a thin film filter include a filter formed by alternately stacking chromium and chromium oxide (III) ($Cr_2O_3$).

The above-described color filters 33 and black matrix 35 may be provided on either surface of the substrate 31. However, it is preferable that they be provided on the surface facing the drive panel 10. This is because such a structure allows the color filters 33 and the black matrix 35 to be protected by the adhesive layer 35 without being exposed to the outside.

<Method for Driving Display Device>

The display device 1 having the above-described configuration is driven as follows. For example, if the display device 1 is based on the chromaticity coordinate system shown in FIG. 4A, for displaying in which the colors can be represented by using the red light h(R), the green light h(G), and the blue light h(B) of the light beams h of the respective colors emitted from four pixels, only three pixels that offer these light beams are driven without using the dark blue light h(Db). Furthermore, for displaying in which the colors may not be represented unless the dark blue light h(Db) is used but can be represented by the red light h(R), the green light h(G), and the dark blue light h(Db), only three pixels that offer these light beams are driven without using the blue light h(B). Moreover, for displaying in which the colors may not be represented unless the dark blue light h(Db) is used but can be represented by the green light h(G), the blue light h(B), and the dark blue light h(Db), only three pixels that offer these light beams are driven without using the red light h(R).

If the display device 1 is based on the chromaticity coordinate system shown in FIG. 4B, for displaying in which the colors can be represented by the red light h(R), the green light h(G), and the blue light h(B), only three pixels that offer these light beams are driven without using the dark blue light h(Db). In contrast, for displaying in which the colors may not be represented unless the dark blue light h(Db) is used, only three pixels that offer the red light h(R), the green light h(G), and the dark blue light h(Db) are driven without using the blue light h(B).

<Method for Manufacturing Display Device>

This display device can be manufactured in the following manner for example.

Initially, on the substrate 31 for the sealing panel, the material film of the black matrix 35 composed of the above-described material is deposited and patterned into a predetermined shape. Subsequently, the material film of the red filter 33(r) is applied by spin-coating or the like over the substrate 31, and then is patterned by a photolithography technique and baked, to thereby form the red filter 33(r). The patterning is so performed that the peripheral part of the red filter 33(r) overlaps with the black matrix 35. This is because it is difficult to perform the patterning with high accuracy without permitting the red filter 33(r) to overlap with the black matrix 35 and the part overlapping with the black matrix 35 has no effect on image displaying. Subsequently, the green filter 33(g), the blue filter 33(b), and the dark blue filter 33(Db) are sequentially formed similarly to the red filter 33(r). There is no particular limitation on the formation order of these color filters 33(r), 33(g), 33(b), and 33(Db). Through the above-described steps, the sealing panel 30 is formed.

On the other hand, the transistors Tr, the insulating layer 13, and the drive interconnects 15 are sequentially formed over the substrate 11 for the drive panel. Subsequently, the planarization insulating film 17 is formed by e.g. spin-coating, and then the connection holes 17a are formed in the planarization insulating film 17 by exposure and development, followed by baking.

Subsequently, the material film of the lower electrodes 21 is deposited on the planarization insulating film 17 by e.g. sputtering or evaporation, and then etching in which a resist pattern is used as the mask is performed to thereby obtain the lower electrodes 21 patterned into a predetermined shape.

Subsequently, photosensitive resin is so applied across the entire surface of the substrate 11 as to cover the lower electrodes 21, and then the resin is processed by e.g. photolithography into a shape that exposes the center parts of the lower electrodes 21 based on a predetermined shape, followed by baking. As a result, the window insulating film 19 is obtained.

Thereafter, by e.g. evaporation, the hole injection layer 22-1, the hole transport layer 22-2, the light-emitting layer 22-3, the electron transport layer 22-4, the electron injection layer 22-5, and the upper electrode 23 that each have the above-described thickness and each are composed of the above-described material are sequentially deposited corresponding to the apertures of the window insulating film 19. In this deposition, for at least the light-emitting layer 22-3, a material film that is selected for each kind of pixel is pattern-formed. At least the cathode 23 is deposited as an electrode common to all the pixels. Through the above-described steps, the organic electroluminescence elements EL like that shown in FIG. 3 are formed. Subsequently, the protective layer 25 is formed on the organic electroluminescence elements EL according to need. Thereby, the drive panel 10 is formed.

After the formation of the sealing panel 30 and the drive panel 10, the adhesive layer 35 is formed by coating on the surface of the drive panel 10 closer to the organic electroluminescence elements EL, and then the drive panel 10 and the sealing panel 30 are bonded to each other with the intermediary of the adhesive layer 35 therebetween. This completes the display device 1 shown in FIG. 2.

In the display device 1 having the configuration described above for the embodiment, one pixel group is composed of the red pixel a(R), the green pixel a(G), and two blue pixels that offer y-values different from each other in the xy chromaticity coordinate system, i.e., the blue pixel a(B) and the dark blue pixel a(Db). This feature allows representation of blue with high color purity (blue with a low y-value), which may not be represented in related arts, through use of the dark blue pixel a(Db), which can expand the color gamut and thus can contribute to enhancement in the performance of the display device.

Moreover, for the blue pixel a(B) that offers a higher y-value, the light-extraction efficiency can be enhanced by using a blue filter of a low density. Therefore, if there is no need to expand the color gamut toward blue of a lower y-value, the blue pixel a(B), which offers a higher y-value and has more favorable light-extraction efficiency, is selected and used without using the dark blue pixel a(Db), so that power consumption is reduced. In particular, the necessary current for the blue light-emitting element EL(b) is large. Thus, the selection and use of the blue pixel a(B) without use of the dark blue pixel a(Db) can suppress power consumption.

Specifically, the superiority of the blue pixel a(B) over the dark blue pixel a(Db) in power consumption is attributed to difference in loss due to the absorption of the color filter 33. That is, maximally utilizing the light emission of the blue pixel a(B), in which optical loss due to the color filter 33 is small, leads to the reduction in power consumption. On the other hand, the dark blue pixel a(Db) can expand the color gamut by representing dark blue based on color filter characteristics.

As a result of the above-described features, in the displays device 1 including light-emitting elements and electronic apparatus employing the display device 1, the reproducibility can be enhanced through expansion of the color gamut due to light emission with high color purity, which may not be realized in a related-art RGB system. In addition, power consumption can be suppressed due to high-efficiency light emission achieved by maximally utilizing favorable light-extraction efficiency. Due to these advantages, a display device employing organic electroluminescence elements that offer high display quality and have low annual power consumption can be realized. In addition, extension of the lifetime of light-emitting elements (organic electroluminescence elements) can be achieved.

Furthermore, in the above-described embodiment, the respective organic electroluminescence elements EL are formed to have a resonator structure. Thus, light generated by the light-emitting layer 22-3 is extracted with high extraction efficiency, which provides high front luminance and high color purity. This feature can also enhance the color representation performance and reduce power consumption.

Moreover, because the transistors Tr and the drive interconnects 15, which have an effect on the aperture ratio, are provided on the opposite side to the light-extraction side of the organic electroluminescence elements EL, a high aperture ratio can be kept and the displaying performance can be enhanced. This feature is extremely favorable also when organic TFTs are used as the transistors Tr.

It should be noted that the above-described embodiment is one example and the present invention is not limited to the embodiment.

For example, in the above-described embodiment, the color filters 33 are provided for all of the pixels a of the respective colors. However, the configuration is not limited thereto as long as one of two pixels including at least the blue light-emitting element EL(b) is provided with a color filter that yields difference in the y-value in the xy chromaticity coordinate system between the blue light beams emitted from these two pixels. Therefore, e.g. a configuration may be employed in which the red pixel a(R), the green pixel a(G), and the blue pixel a(B) are not provided with a color filter. In particular, employing a configuration in which the blue pixel a(B) is not provided with the color filter 33 can further enhance the light-extraction efficiency in the case of displaying in which the blue pixel a(B) is used without using the dark blue pixel a(Db), and thus enhances the effect of suppressing power consumption.

Furthermore, in the above-described embodiment, the display device 1 is driven based on the active-matrix drive system. However, the embodiment can be applied also to a display device of the simple-matrix drive system, and the same advantages can be achieved also in this case.

Moreover, the materials, thicknesses, deposition methods, and deposition conditions of the respective layers are not limited to those described for the embodiment, but other materials, thicknesses, deposition methods, and deposition conditions may be employed. For example, the substrate 11 of the drive panel may be formed of a silicon (Si) or plastic substrate instead of a glass substrate. Furthermore, if the simple-matrix drive system is employed, thin film transistors do not necessarily need to be formed above the substrate 11.

In addition, although specific materials and thicknesses are shown as examples regarding the respective layers of the display device 1 in the above description of the embodiment, the display device 1 does not need to include all of the described layers but may further include another layer. For example, the provision of the protective layer 25 is according to need.

Furthermore, it is also possible for the lower electrode 21 used as the anode to have a two-layer structure obtained by stacking a transparent conductive film on a dielectric multilayer film or a reflective film composed of Al or the like. In this case, the surface of the reflective film closer to the light-emission functional layer 22 serves as an end of a resonator, and the transparent conductive film senses as a partial portion of the resonator.

On the other hand, the upper electrode 23 used as the cathode may have a structure obtained by sequentially stacking a semi-transparent metal thin film and a transparent electrode in that order from the light-emission functional layer side. This transparent electrode is to decrease the electric resistance of the semi-transparent metal thin film, and is composed of a conductive material having sufficient optical transparency for light generated by the light-emitting layer 22-3. As the material of the transparent electrode, e.g. ITO or a compound containing indium, zinc (Zn), and oxygen is preferable. This is because these materials can offer favorable conductivity even when the transparent electrode is deposited at a room temperature. The thickness of the transparent electrode is in the range of e.g. 30 nm to 1000 nm.

The first end P1 and the second end P2 serving as the end faces of a resonator are not limited to the interface between the lower electrode 21 and the light-emission functional layer 22 and the interface between the light-emission functional layer 22 and the upper electrode 23, but may be formed at the interface between other layers that are composed of two kinds of materials having different refractive indexes.

For example, if the upper electrode (cathode) 23 is formed of a transparent electrode and the end face of this transparent electrode remoter from the light-emission functional layer 22 has sufficiently high reflectivity, it is also possible that this end face be used as the second end P2 of a resonator structure. In this case, the transparent electrode may, be brought into contact with the atmospheric layer, and the interface between the transparent electrode and the atmospheric layer may be used as the second end P2 by setting the reflectivity of the interface high. Alternatively, the interface with the adhesive layer 35 may be used as the second end P2 by setting the reflectivity of the interface high. More alternatively, the interface with the protective film 25 formed to cover the organic electroluminescence elements EL may be used as the second end P2 by setting the reflectivity of the interface high.

Figure 5:
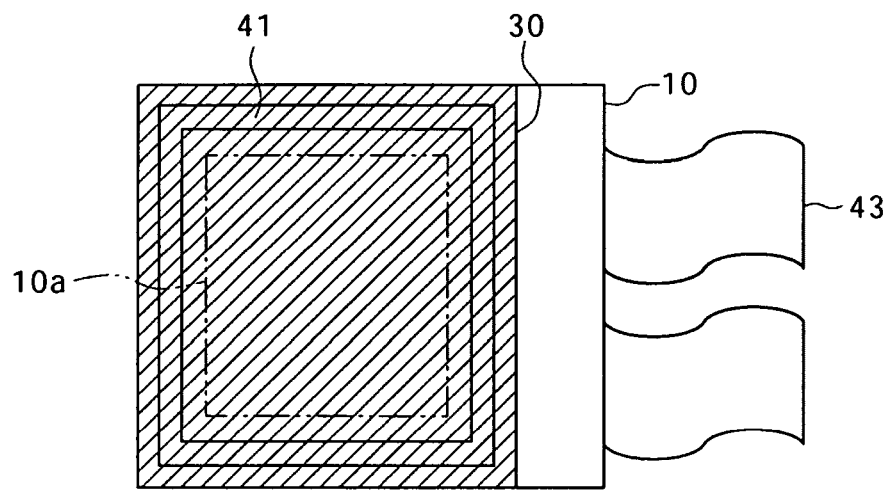
FIG. 5 is a configuration diagram showing a module-shape display device having a sealed structure to which the embodiment is applied.

The display device according to the above-described embodiment encompasses also a module-shape display device having a sealed structure like that shown in FIG. 5. For example, the display module shown in FIG. 5 is formed by providing a sealing part 41 surrounding the display area 10a as a pixel array part and bonding the substrate including the display area 10a to a counter member (e.g., the above-described sealing panel 30) such as a transparent glass substrate by use of the sealing part 41 as an adhesive. The drive panel 10 as the display module on which the display area 10a is formed may be provided With a flexible printed board 43 for input/output of signals and so on to/from the display area 10a (pixel array part) from/to the external.

APPLICATION EXAMPLES

The display device according to the above-described embodiment can be applied to various kinds of electronic apparatus shown in FIGS. 6 to 10. Specifically, the display device can be used as a display device part in electronic apparatus in any field that displays a video signal input thereto or produced therein as an image and video, such as a digital camera, notebook personal computer, portable terminal apparatus typified by a cellular phone, and video camera. Examples of electronic apparatus to which the embodiment is applied will be described below.

Figure 6:
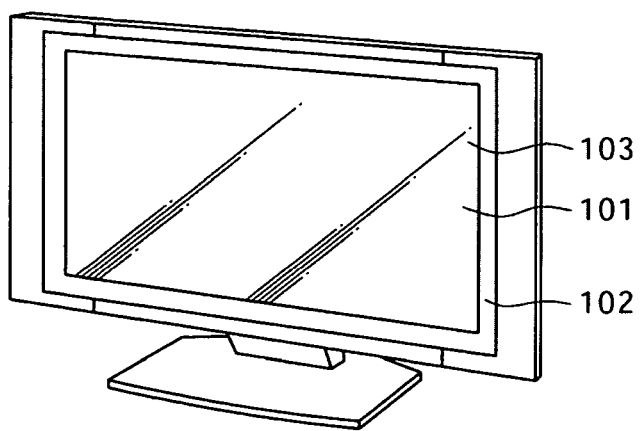
FIG. 6 is a perspective view showing a television to which the embodiment is applied.

FIG. 6 is a perspective view showing a television to which the embodiment is applied. This television includes a video display screen 101 composed of a front panel 102, a filter glass 103, and so on, and is fabricated by using the display device according to the embodiment as the video display screen 101.

Figure 7A:
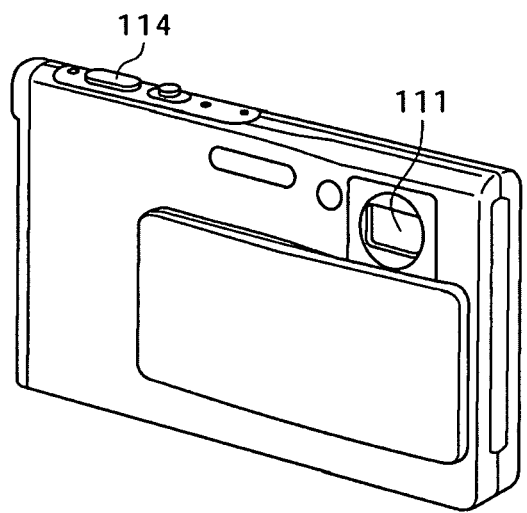
FIGS. 7A and 7B are diagrams showing a digital camera to which the embodiment is applied: 7A is a front-side perspective view and 7B is a rear-side perspective view.
Figure 7B:
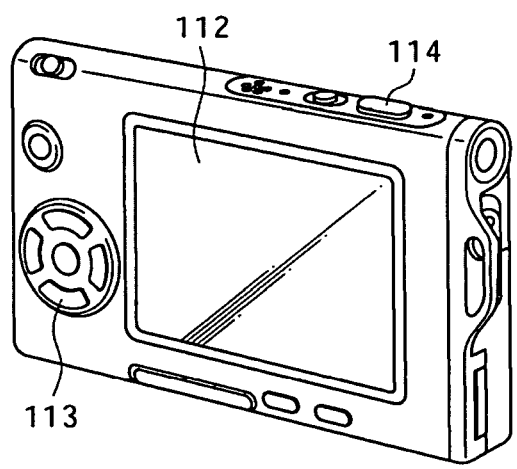

FIG. 7 is a diagram showing a digital camera to which the embodiment is applied: 7A is a front-side perspective view and 7B is a rear-side perspective view. This digital camera includes a light emitter 111 for flash, a display part 112, a menu snitch 113, a shutter button 114, and so on, and is fabricated by using the display device according to the embodiment as the displays part 112.

Figure 8:
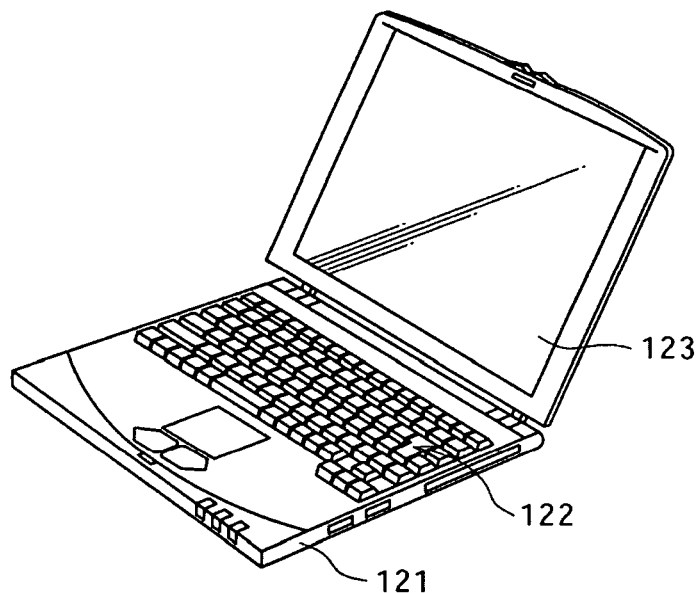
FIG. 8 is a perspective view showing a notebook personal computer to which the embodiment is applied.

FIG. 8 is a perspective view showing a notebook personal computer to which the embodiment is applied. This notebook personal computer includes in a main body 121 thereof a keyboard 122 operated in inputting of characters and so forth, a display part 123 for displaying images, and so on. The notebook personal computer is fabricated by using the display device according to the embodiment as the display part 123.

Figure 9:
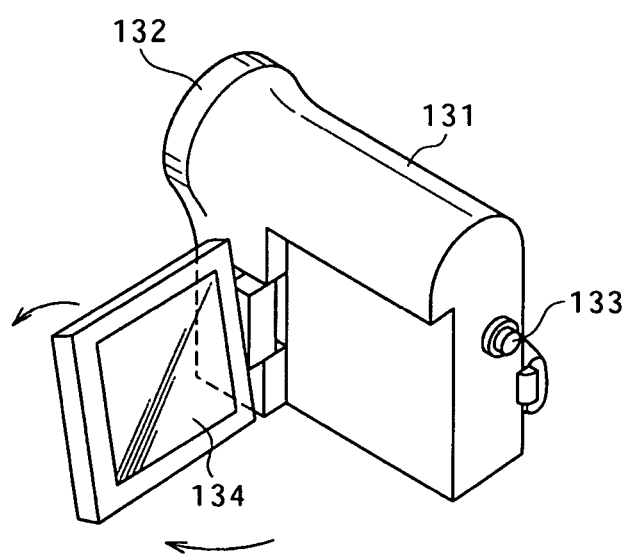
FIG. 9 is a perspective view showing a video camera to which the embodiment is applied.

FIG. 9 is a perspective view showing a video camera to which the embodiment is applied. This video camera includes a main body 131, a lens 132 that is disposed on the front side of the camera and used to capture a subject image, a start/stop switch 133 regarding imaging, a display part 134, and so on. The video camera is fabricated by using the display device according to the embodiment as the display part 134.

FIG. 10 is a diagram showing a cellular phone as portable terminal apparatus to which the embodiment is applied: FIG. 10A and FIG. 10B are a front view and side view, respectively, of the opened state, and FIGS. 10C to 10G are a front view, left-side view, right-side view, top view, and bottom view, respectively, of the closed state. This cellular phone includes an upper casing 141, a lower casing 142, a connection (hinge) 143, a display 144, a sub-display 145, a picture light 146, a camera 147, and so on. The cellular phone is fabricated by using the display device according to the embodiment as the display 144 and the sub-display 145.

WORKING EXAMPLES

A top-emission displays device having a resonator structure was fabricated as a working example of the present invention in the following manner.

Initially, over the substrate 11 composed of glass for the drive panel, an aluminum-neodymium alloy film having a thickness of 100 nm was deposited as the lower electrodes 21 serving as the anodes. Subsequently, a photosensitive resin film composed of polyimide was deposited, and then apertures having a size of 2 μm×2 μm were provided in the photosensitive resin film by lithography, so that the window insulating film 19 that exposes the lower electrodes 21 was formed.

Subsequently, a metal mask having apertures corresponding to the exposed parts of the lower electrodes 21 was disposed near the substrate 11. In this state, the hole injection layer 22-1 that was composed of a hexaazatriphenylene derivative and had a thickness of 8 nm was formed by vacuum evaporation under a pressure lower than $10^{-4}$ Pa. Subsequently, by vacuum evaporation, the hole transport layer 22-2, the respective light-emitting layers 22-3(r), 22-3(g), and 22-3(b), the electron transport layer 22-4, and the electron injection layer 22-5 that were composed of the materials shown for the embodiment were sequentially formed, so that the light-emission functional layers 22 were formed. The thickness of the light-emission functional layer 22 was designed as follows so that light could be extracted efficiently based on an optical resonator structure: 130 nm for the red light-emitting element EL(r), 105 nm for the green light-emitting element EL(g), and 85 nm for the blue light-emitting element EL(b). These thicknesses were obtained through adjustment of the respective light-emitting layers and the electron transport layer.

Subsequently, by vacuum evaporation, a film that had a thickness of 10 nm was formed as the upper electrode 23 serving as the cathode by co-evaporation of magnesium (Mg) and silver (Ag) (Mg:Ag=10:1).

Through the above-described steps, the red light-emitting element EL(r), the green light-emitting element EL(g), and two blue light-emitting elements EL(b) were obtained.

Subsequently, for adjustment of the color purity of the organic electroluminescence elements EL(r), EL(g), and EL(b) of the respective colors, the color filters 33(r), 33(g), 33(b), and 33(Db) of the respective colors were attached. Specifically, the red filter 33(r) was attached for the red light-emitting element EL(r) and the green filter 33(g) was attached for the green light-emitting element EL(g). Furthermore, the blue filter 33(b) was attached for one blue light-emitting element EL(b) and the dark blue filter 33(Db) was attached for the other blue light-emitting element EL(b).

Figure 11:
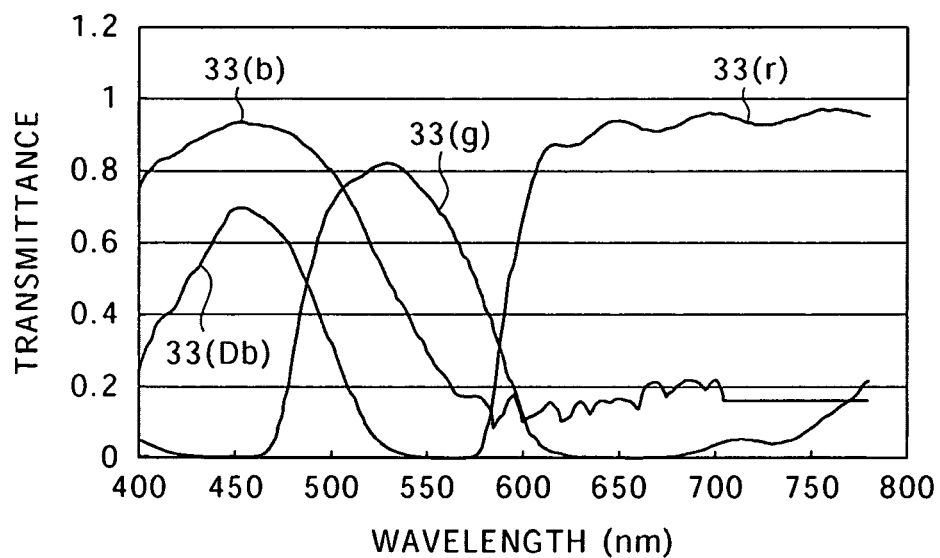
FIG. 11 is a diagram showing the optical transmission characteristics of color filters of the respective colors.

FIG. 11 shows the optical transmission characteristics of the color filters 33(r), 33(g), 33(b), and 33(Db) of the respective colors used in the working example.

Through the above-described steps, the four-color pixels a(R), a(G), a(B), and a(Db) as one pixel group in the display device 1 shown in FIG. 2 were obtained.

Figure 12:
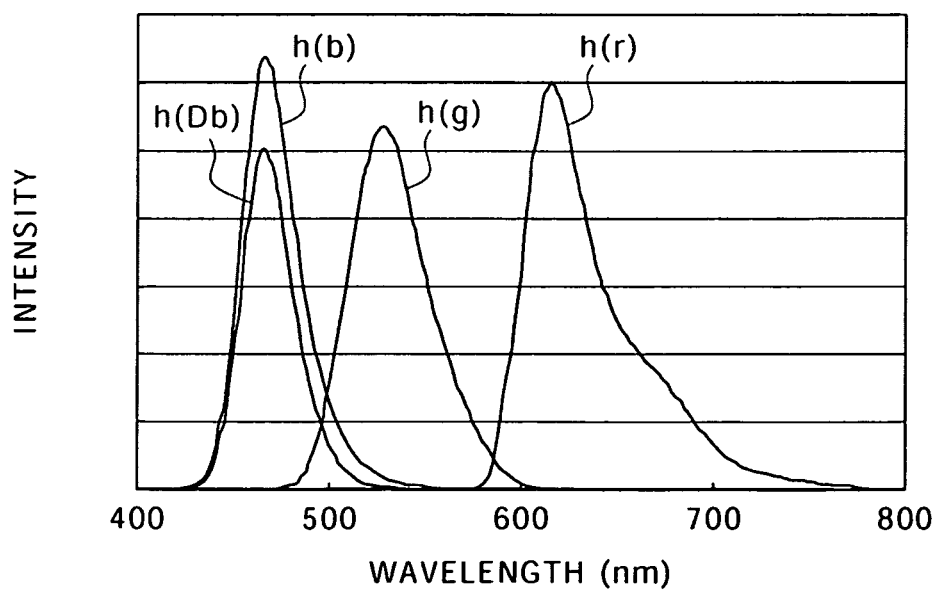
FIG. 12 is a diagram showing the emission spectra of light beams of the respective colors extracted from the respective pixels through the color filters of the respective colors.

FIG. 12 shows the emission spectra of the light beams h(r), h(g), h(b), and h(Db) that were emitted from the pixels a(R), a(G), a(B), and a(Db) having the above-described configurations through the color filters 33(r), 33(g), 33(b), and 33(Db).

Table 1 shows the chromaticity coordinates of these light beams h extracted from the respective pixels. These xy chromaticity coordinates correspond to the patterns shown in FIG. 4.

TABLE 1

| | Chromaticity coordinate | |
|---|---|---|
| | x | y |
| a(R) red pixel | 0.6704 | 0.3294 |
| a(G) green pixel | 0.2331 | 0.7042 |
| a(B) blue pixel | 0.1268 | 0.0916 |
| a(Db) dark blue pixel | 0.1289 | 0.0708 |

Table 2 shows the color gamut of a display device of an RGB three-color display system, a displays device of an RGDb three-color display system, and a display device of an RGBDb four-color display system. The color gamut is represented by the value obtained as the NTSC ratio on each of the (x, y) chromaticity coordinate system and the (u', v') chromaticity coordinate system.

TABLE 2

| | Color gamut:NTSC ratio (%) | |
|---|---|---|
| Light-emission pixel | (x, y) | (u', v') |
| RGB | 97.3 | 94.2 |
| RGDb | 99.9 | 103.6 |
| RGBDb | 99.9 | 103.6 |

The result of Table 2 clearly shows that the RGBDb four-color displaying and the RGDb three-color displaying provide wider color gamut compared with the RGB three-color displaying. Furthermore, it is found that the color gamut is particularly wider in the (u', v') chromaticity coordinate system, which is closer to the human visual characteristic, and thus enhancement in the displaying performance due to the use of the dark blue light h(Db) is confirmed.

Table 3 shows the light-emission efficiency (necessary, current) and the power consumption ratio regarding white displaying by the display device of the RGB three-color display system, the display device of the RGDb three-color displays system, and the display device of the RGBDb four-color displays system. In the white displaying, the white corresponding to the chromaticity (x, y)=(0.2718, 0.2776) and a color temperature of 12000 K was displayed. For the power consumption ratio, the ratio of the RGDb three-color displaying is defined as 1 for comparison.

TABLE 3

| Pixel arrangement | Necessary current for white light emission | | | | Power consumption ratio |
|---|---|---|---|---|---|
| | R pixel | G pixel | B pixel | Db pixel | |
| RGB | 1.75 | 1.69 | 3.78 | 0 | 0.8 |
| RGDb | 1.71 | 1.85 | 0 | 4.87 | 1 |
| RGBDb | 1.75 | 1.69 | 3.76 | 0 | 0.8 |

White (x, y) = (0.2718, 0.2776); color temperature 12000 K

As is apparent from the result of Table 3, the RGBDb four-color displaying can decrease the power consumption in the white displaying by 20% compared with the RGDb three-color displaying, as with the RGB three-color displaying.

Table 4 shows the light-emission efficiency (necessary current) and the power consumption ratio regarding blue displaying by the displays device of the RGB three-color display system, the display device of the RGDb three-color display system, and the display device of the RGBDb four-color displays system. In the blue displaying, the blue corresponding to the chromaticity (x, y)=(0.133, 0.095) was displayed. For the power consumption ratio, the ratio of the RGDb three-color displaying is defined as 1 for comparison.

TABLE 4

| Pixel arrangement | Necessary current for blue light emission | | | | Power consumption ratio |
|---|---|---|---|---|---|
| | R pixel | G pixel | B pixel | Db pixel | |
| RGB | 0.05 | 0 | 3.58 | 0 | 0.71 |
| RGDb | 0 | 0.16 | 0 | 4.64 | 1 |
| RGBDb | 0.05 | 0 | 3.58 | 0 | 0.71 |

Blue (x, y) = (0.133, 0.095)

As is apparent from the result of Table 4, also when a color close to the single-color blue (B) is displayed, the RGBDb four-color displaying can decrease the power consumption in the blue displaying by 29% compared with the RGDb three-color displaying, as with the RGB three-color displaying.

Due to the above-described results, the following fact is confirmed. Specifically, by the drive system according to the embodiment of the present invention, the superiority of the RGBDb four-color displaying over the RGDb three-color displaying in power consumption can be assured for the entire region of the colors that can be represented by the RGB three-color displaying, by suppressing displaying with use of the dark blue light h(Db), which has favorable chromaticity but is disadvantageous in terms of power consumption, to the necessary minimum and maximally utilizing the blue light h(B), whose y-value in the xy chromaticity coordinate system is higher than that of the dark blue light h(Db).

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device comprising:
    a red pixel provided with a red light-emitting element that generates red light;
    a green pixel provided with a green light-emitting element that generates green light;
    a first blue pixel emitting blue light having a first y-value in an xy chromaticity coordinate system, wherein the first blue pixel is provided with a first blue light emitting element that generates blue light;
    a second blue pixel emitting blue light having a second y-value in the xy chromaticity coordinate system different from the first y-value, wherein the second blue pixel is provided with a second blue light emitting element that generates blue light, and wherein the first blue light emitting element and the second blue light emitting element are made of a same material having a same lifetime characteristic and that generates a same blue light; and
    a blue color filter provided on a light-extraction side of the first blue pixel that extracts blue light beams from the blue light generated by the first blue light emitting element.

2. The display device according to claim 1, wherein
    a chromaticity coordinate of blue light extracted from one of the first and second blue pixels is located in a direction toward a center among a chromaticity coordinate of red light extracted from the red pixel, a chromaticity coordinate of green light extracted from the green pixel, and a chromaticity coordinate of blue light extracted from the other of the first and second blue pixels.

3. The display device according to claim 1, wherein
    each of the light-emitting elements is an organic electroluminescence element.

4. The display device according to claim 1, wherein
    each of the light-emitting elements has a resonator structure that allows resonance of light of a respective one of colors.

5. The display device according to claim 4, wherein
    the resonator structure comprises a separate light-emission functional layer for each of said red pixel, said green pixel, said first blue pixel, and said second blue pixel.

6. The display device according to claim 5, wherein
    the light-emission functional layer comprises a light-emitting layer and at least one of a hole injection layer, a hole transport layer, an electron transport layer, or an electron injection layer.

7. The display device according to claim 1, wherein the same material is ADN (9,10-di(2-naphthyl)anthracene) and perylene.

8. The display device according to claim 1, wherein each of the first and the second blue light emitting elements include a light emission functional layer having a first end and a second end, and
    an optical distance L between the first end and the second end satisfies:

$L=(m-\Phi/2\pi)\lambda/2$ wherein m is an order, $\Phi$ is a sum of a phase shift of reflected light arising at the first end and a phase shift of reflected light arising at the second end, and $\lambda$ is a peak wavelength of a spectrum of light desired to be extracted through the second end.

9. The display device according to claim 1, wherein the blue color filter absorbs external light reflected by the first blue light-emitting element.

10. The display device according to claim 1, further comprising:
    a dark blue color filter provided on a light-extraction side of the second blue pixel that extracts blue light having a y-value in the xy chromaticity coordinate system lower than blue light obtained through the blue color filter.

11. The display device according to claim 10, wherein each of the first blue pixel provided with the blue color filter and the second blue pixel provided with the dark blue color filer emit light from respective light emitting elements.

12. A method for driving a display device including a red pixel provided with a red light-emitting element that generates red light, a green pixel provided with a green light-emitting element that generates green light, a first blue pixel emitting blue light having a first y-value in an xy chromaticity coordinate system, wherein the first blue pixel is provided with a first blue light emitting element that generates blue light, a second blue pixel emitting blue light having a second y-value in the xy chromaticity coordinate system different from the first y-value, wherein the second blue pixel is provided with a second blue light emitting element that generates blue light, and wherein the first blue light emitting element and the second blue light emitting element are made of a same material having a same lifetime characteristic and that generates a same blue light, a blue color filter provided on a light-extraction side of the first blue pixel that extracts blue light beams from the blue light generated by the first blue light emitting element, the method comprising:
    driving only the red pixel, the green pixel, and one of the first and second blue pixels for displaying in which colors can be represented by these three pixels; and
    driving the red pixel, the green pixel, and both of the first and second blue pixels only for displaying in which color representation is impossible unless these four pixels are used.

13. Electronic apparatus including a display panel, the display panel comprising:
    a red pixel provided with a red light-emitting element that generates red light;
    a green pixel provided with a green light-emitting element that generates green light;
    a first blue pixel emitting blue light having a first y-value in an xy chromaticity coordinate system, wherein the first blue pixel is provided with a first blue light emitting element that generates blue light;
    a second blue pixel emitting blue light having a second y-value in the xy chromaticity coordinate system different from the first y-value, wherein the second blue pixel is provided with a second blue light emitting element that generates blue light, and wherein the first blue light emitting element and the second blue light emitting element are made of a same material having a same lifetime characteristic and that generates a same blue light; and
    a blue color filter provided on a light-extraction side of the first blue pixel that extracts blue light beams from the blue light generated by the first blue light emitting element.

* * * * *